United States Patent [19]
Klein

[11] 4,104,784

[45] Aug. 8, 1978

[54] MANUFACTURING A LOW VOLTAGE N-CHANNEL MOSFET DEVICE

[75] Inventor: Thomas Klein, Saratoga, Calif.

[73] Assignee: National Semiconductor Corporation, Santa Clara, Calif.

[21] Appl. No.: 783,914

[22] Filed: Apr. 1, 1977

Related U.S. Application Data

[63] Continuation-in-part of Ser. No. 697,908, Jun. 21, 1976, abandoned.

[51] Int. Cl.$^2$ .............................................. B01J 17/00
[52] U.S. Cl. ........................................ 29/571; 29/578; 148/187; 357/42
[58] Field of Search ................... 29/571, 578; 148/187; 357/42

[56] References Cited

U.S. PATENT DOCUMENTS

| | | | |
|---|---|---|---|
| 3,447,046 | 5/1969 | Cricchi | 357/42 |
| 3,653,978 | 4/1972 | Robinson | 148/187 |
| 3,867,204 | 2/1975 | Rutledge | 148/187 |
| 3,886,003 | 5/1975 | Takagi | 148/187 |
| 4,062,699 | 12/1977 | Armstrong | 357/42 |
| 4,075,754 | 2/1978 | Cook | 29/571 |

*Primary Examiner*—W. Tupman
*Attorney, Agent, or Firm*—Gail W. Woodward

[57] ABSTRACT

A novel MOSFET circuit and method of manufacture utilizing a double ion implant process for manufacturing a low voltage high performance n-channel device that includes an enhancement transistor inverter combined with a depletion transistor load. The process starts with high resistivity material and uses a first ion implant process to dope the field region and to give the required threshold voltage for an enhancement device. A second ion implant is used to dope the channel region for the depletion device.

6 Claims, 11 Drawing Figures

U.S. Patent    Aug. 8, 1978    Sheet 1 of 2    4,104,784
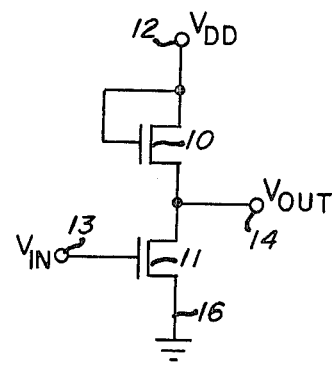
Fig_1 (PRIOR ART)
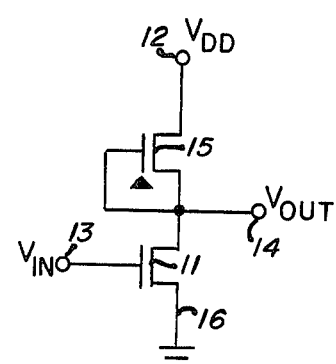
Fig_2 (PRIOR ART)
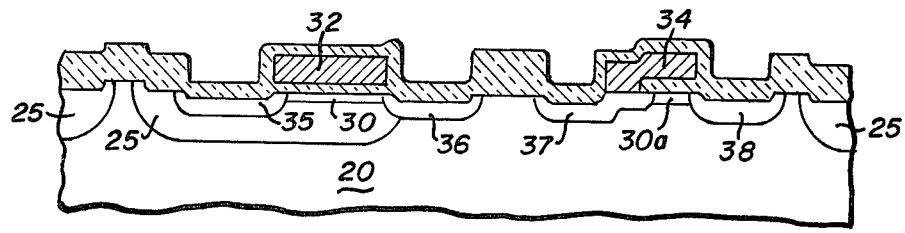
Fig_3g
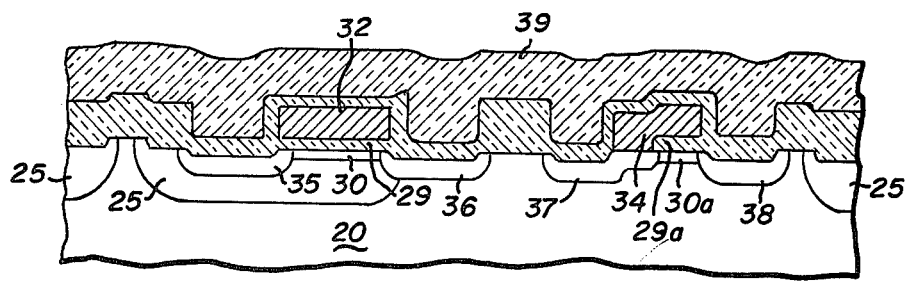
Fig_3h
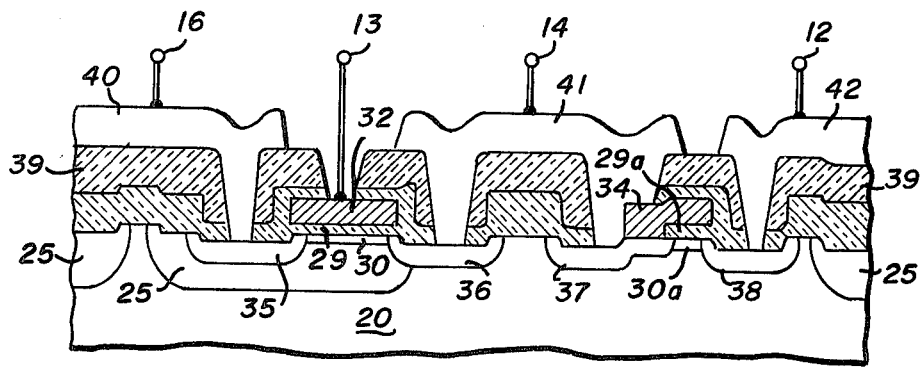
Fig_4

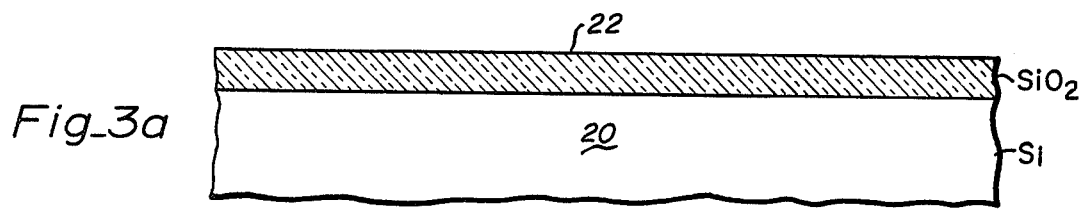
Fig_3a
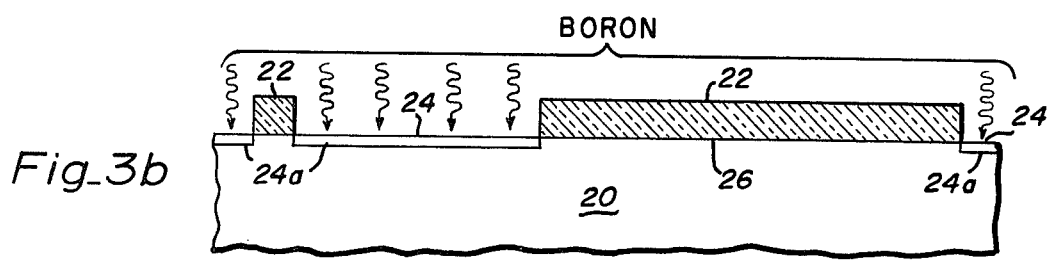
Fig_3b
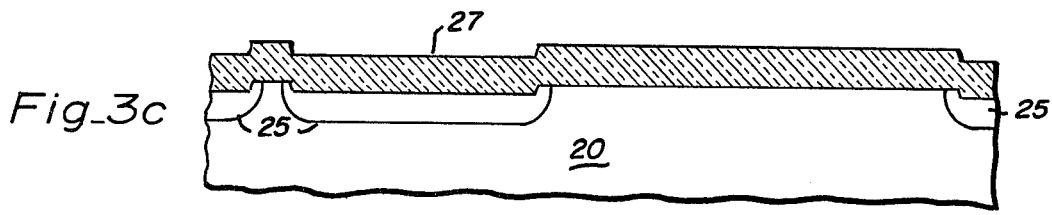
Fig_3c
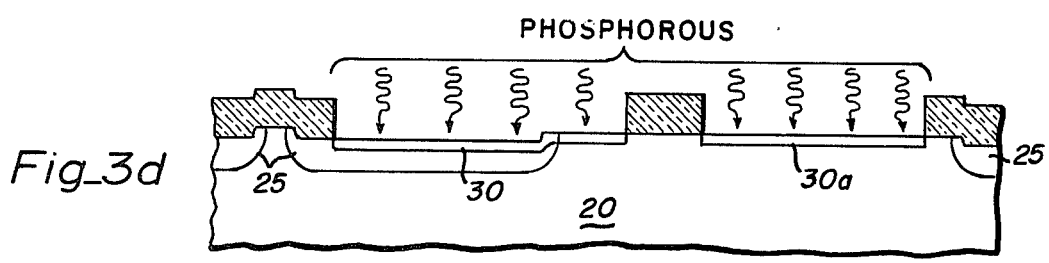
Fig_3d
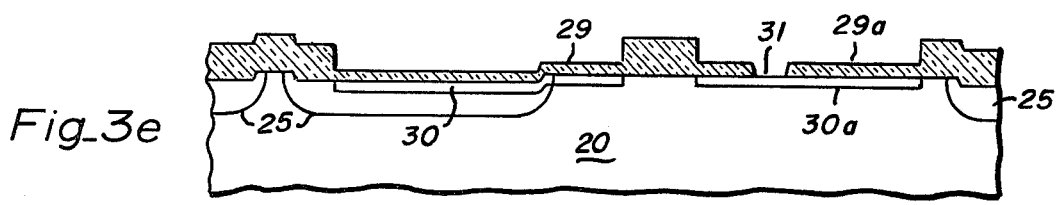
Fig_3e
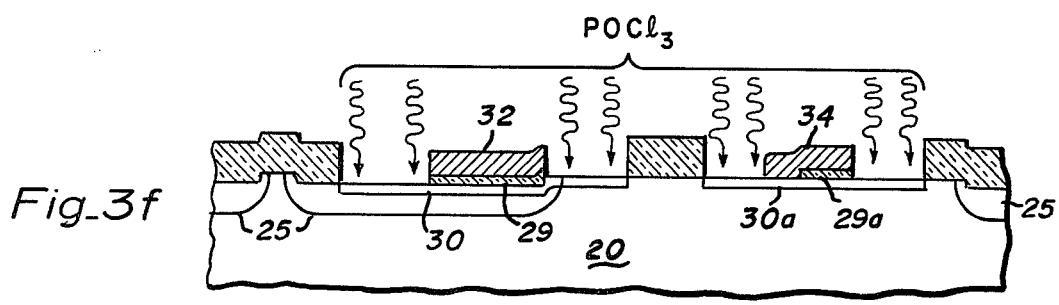
Fig_3f

MANUFACTURING A LOW VOLTAGE N-CHANNEL MOSFET DEVICE

This application is a Continuation In Part of application ser. no. 697,908, filed June 21, 1976, now abandoned.

BACKGROUND OF THE INVENTION

There are two basic kinds of MOS transistors - enhancement and depletion. The enhancement device is made without a conductive path or channel between its source and drain electrodes and is normally non-conductive. If the gate electrode is raised toward drain potential, the semiconductor surface under the gate can be inverted when the potential is sufficient. This inversion creates a conductive path between source and drain and the device becomes conductive. The gate potential at which the device turns on is called threshold voltage or $V_T$. Desirably this voltage is low, in the fractional volt region, but not so low that inadvertent or noise potentials will cause conduction.

In the depletion device a channel is created in manufacture between source and drain and such devices are normally on. Thus $V_T$ is below zero. Thus to turn a depletion device off, the gate potential must be driven below source potential. Also such devices can be made even more conductive by raising the gate potential toward drain potential. The channel doping level and geometry determine its initial conductivity.

To distinguish between the two kinds of MOS transistors, it has become standard practice to place a triangular symbol adjacent to all depletion devices on schematic diagrams.

FIG. 1 shows an inverter circuit typical of the prior art. Enhancement transistors 10 and 11 are series connected between $V_{DD}$ at terminal 12 and ground. The gate of transistor 10 is returned to its drain so that it acts like a resistor load device. When terminal 13 is driven toward $V_{DD}$, transistor 11 will turn on when its $V_T$ is exceeded and it will pull output terminal 14 toward ground. When terminal 13 is driven toward ground, transistor 11 will be turned off when the input is below $V_T$ and transistor 10 will pull output terminal 14 toward $V_{DD}$. Thus the output at terminal 14 is an inverted version of the input at terminal 13.

The actual conductivity of a transistor is a function of the channel width to length (W/L) dimensions in addition to the doping density and channel thickness. Conductivity is proportional to W/L. If transistor 11 is shaped or ratioed to be more conductive than transistor 10, it will pull the output at terminal 14 closer to ground. Thus if $V_{DD}$ is 5 volts and transistor 11 is nine times more conductive than transistor 10, the output will be pulled to about 0.5 volt when transistor 11 is on. When transistor 11 is off, transistor 10 will pull terminal 14 to one $V_T$ below $V_{DD}$ at which potential it will also turn off. If a $V_T$ of two volts (including body effect) is assumed, terminal 14 can only be pulled to about three volts by transistor 10 to give an output swing of 2.5 volts. In some circuit designs this swing is regarded as too limiting.

In the circuit of FIG. 2 a depletion transistor 15 (as indicated by the triangular symbol) is series connected with enhancement transistor. The gate is returned to the source so that the transistor acts like a resistor. In the case of FIG. 2, it can be seen that in the on state of transistor 11 the ratioing is the same as it was in FIG. 1 because both devices are on. A nine to one ratio will produce a 0.5 volt output using a five volt supply. However, since transistor 15 is always conductive, it can pull terminal 14 very close to $V_{DD}$ when transistor 11 is off. In other words, $V_T$ doesn't limit the output swing in FIG. 2.

In another sense it can be seen in FIG. 1 that $V_{DD}$ must exceed $V_T$ before the circuit can work at all. In FIG. 2, the circuit can function as an inverter at $V_{DD}$ levels below $V_T$.

Thus it is clear that the circuit of FIG. 2 is often to be preferred. However, it is difficult to manufacture and optimize both depletion and enhancement transistors on the same substrate. A controlled resistivity substrate is required to make enhancement devices having a desired value of $V_T$. It is desirable to have a relatively low substrate resistivity in all substrate areas where there are no transistors in order to avoid surface inversion under conductors located on top of the passivating oxide. In a depletion device a high resistivity substrate is desired in order to reduce the effect of the substrate bias on the channel region. Clearly the various requirements conflict and local variations in resistivity must be achieved in order to integrate devices on a single substrate. The prior art methods of combining enhancement and depletion devices on the same substrate have resulted in compromises that adversely affect device performance. In terms of processing, the prior art devices were ordinarily manufactured using a triple implant process. One implant was used to establish the enhancement transistor channel resistivity, a second implant used to establish the depletion transistor channel, and a third implant used to establish filed resistivity in the area around the transistors.

SUMMARY OF THE INVENTION

It is an object of the invention to provide a method of manufacturing a MOSFET device that has improved performance by fabricating adjacent depletion and enhancement devices connected so the depletion device acts as a load for the enhancement device in an inverter circuit.

It is a further object of the invention to fabricate depletion and enhancement devices together on a common substrate using only two implants in a process that permits both types to be optimized.

It is a still further object of the invention to manufacture depletion and enhancement devices on a high resistivity substrate, using only two implants and a minimum of process masking steps in a process that provides field doping to prevent surface inversion under conductors.

The above objects are accomplished on a high resistivity wafer by exposing those areas where field inversion is to be avoided and those areas that are to contain enhancement transistors to a first ion implantation having a conductivity type and same as that of the substrate. The doping density is adjusted so that after diffusion the concentration is slightly greater than would be desired in enhancement device gate regions.

A second ion implantation is performed using an opposite conductivity type impurity. This implantation is applied where both enhancement and depletion devices are to be located. The density is adjusted to create the desired depletion device channel doping level. In the enhancement device areas the second ion implant compensates the first implant and acts to lower $V_T$ to the desired final value.

After ion implantation the gate oxide is grown and polysilicon gates deposited. Then source and gate junction contacts are fabricated using the conventional polysilicon self aligning gate process, a phosphosilicate glass deposited, and conventional final metalization is applied.

Using the above process means that closely spaced depletion and enhancement type devices can be interconnected into an inverter structure. Both device types can be optimized to provide maximum performance.

BRIEF DESCRIPTION OF THE DRAWING

FIG. 1 is a schematic diagram of a prior art enhancement type of MOSFET inverter;

FIG. 2 is a schematic diagram of a prior art MOSFET inverter using a depletion type transistor load;

FIGS. 3a through 3h are cross section views of a silicon wafer showing various stages in the manufacturing process of the invention; and FIG. 4 is a cross section view of a completed inverter using the process of the invention.

DESCRIPTION OF THE INVENTION example, 58

Referring now to FIGS. 3a through 3h, the method of manufacturing a device in accordance with the present invention will be described. The figures show cross section views of a portion of a silicon wafer in which the inverter is to be fabricated. The drawing is not to scale but is distorted, particularly in the vertical dimension, to more clearly show the various layers. For example, the gate oxides are about 1000 Å thick or about 1/10 the thickness of the field oxide. Also the area shown is around a single inverter which comprises only a tiny fraction of a wafer being processed. Such a wafer contains many complete circuits, each of which will contain many inverters.

The starting material 20 is a high resistivity p-type (100) oriented silicon wafer. In the invention a resistivity of about 10 ohm centimeters or greater is to be used. Resistivity in the 25 to 45 ohm centimeter range is preferred. The wafer is first placed into an oxidizing atmosphere at high temperature and a layer 22 of silicon dioxide about 0.8 microns thick, is formed on its surface (FIG. 3a). Next, the oxide is removed in regions 24 which includes the field regions (the outer extremes) and the source, drain and the channel region of the final enhancement device. The areas to be removed are defined by photomasking and etching. The result is shown in FIG. 3b. The region 26 where the depletion type device is to be formed is left unetched.

The wafer is then placed in an ion implanter and boron, a p-type impurity, is implanted into the surface of the structure as shown by the bracket in FIG. 3b. The boron impurities cause a relatively high doping to occur in those regions exposed through the mask and labeled 24a. The regions under the oxide covered areas, between devices, and where the depletion mode device is to be formed are unaffected.

After the ion implantation, the oxide indicated at 22 is etched to reduce its thickness to about one half of it initial thickness and the structure is then returned to the oxidizing atmosphere. The wafer is reoxidized, forming a layer 27 of silicon dioxide to recover the entire surface as shown in FIG. 3c. Since the original oxide was reduced in thickness prior to reoxidation, small controlled steps are created at the top surface of layer 27. During the oxide regrowth the boron deposit will have diffused to form p-type regions 25 as shown. The boron implant is selected so that after processing is completed, the doping in regions 25 has the desired resistivity. Next, as shown in FIG. 3d, photolithographic cuts are made in the oxide layer in regions where both enhancement and depletion devices are to be located. These cuts are shown as the oxide openings over regions 30 and 30a of FIG. 3d. It will be noted that region 30a overlaps region 25. The reason for this will be explained hereinafter. The wafer is then again placed into an ion implanter and phosphorus, an n-type impurity, is implanted as shown by the bracket into the surface of the structure to create the phosphorous doped regions, 30a for the depletion mode device and 30 for the enhancement device. Since the enhancement device over the center region 25 was relatively heavily doped with boron, the phosphorus implant at 30 will have only a small effect in the region of the enhancement type device. Region 30a being on high resistivity material produces a junction and an n-type surface channel. Typically this channel will be more heavily doped than the substrate.

Thus, the relatively high doping in the region 25 of the enhancement device followed by the n-type doping results in the desired value of threshold voltage. The relatively low substrate doping in the substrate under region 30a of the depletion device results in a channel that produces a device having a low M factor. This means that the depletion type device will deliver the desired current when utilized in an inverter in combination with the low voltage enhancement type device.

In N-channel devices the semiconductor substrate is ordinarily connected to the most negative potential in the circuit. While not shown in the drawing, in the inverter of FIG. 2 the substrate would be connected to ground terminal 16. It can be seen that the source and gate of depletion device 15 will be positive with respect to the substrate and therefore the channel to substrate junction will be reversed biased. The amount of reverse bias will be determined by the potential at the output terminal 14. The depletion region thus formed will react on the channel on the side opposite the gate. This means that even if the gate is returned to its source, the conductivity of the depletion channel will be reduced as the output terminal 14 is pulled toward $V_{DD}$. This action reduces the current sourcing capability of device 15, and is called the body effect. Its measure is called M factor.

M factor will be reduced if either the gate oxide thickness is reduced or the substrate resistivity increased. Since the gate oxide thickness is determined by yield and reliability considerations, raising substrate resistivity is the best way to reduce M factor. As described above, the process of the invention permits the use of desirably high resistivity substrate material.

The device structure is completed using conventional silicongate self-aligning MOS technology manufacturing. The remainder of the description will detail how to complete the fabrication of the gates for both the enhancement mode device and the depletion mode device, the source and drain electrodes, and the contacts. This can be done, for example, as follows. After the ion implantation of regions 30 and 30a of FIG. 3d, the wafer is cleaned and the thin gate oxide grown as shown at 29 and 29a in FIG. 3e. A hole is then photolithographically etched in gate oxide 29a at 31 as shown. The wafer is then coated with a deposit of polycrystalline silicon (polysilicon) in the conventional manner and this layer is photolithographically etched back to leave gates and gate contacts as shown at 32 and 34 respectively in FIG. 3f. It will be noted that gate 32 of the enhancement device is fully isolated by gate oxide 29. However, gate 34 contacts the underlying silicon by way of hole 31 of FIG. 3e. This will ultimately serve to connect the depletion device gate to its source electrode.

The wafer is again subjected to an etching operation in which the polysilicon at 32 and 34 acts as a mask and the exposed portions of oxide layers 29 and 29a removed to create the structure shown in FIG. 3f. It can be seen that the gate oxide remaining at 29 and 29a is self aligned with gate 32 and 34 respectively. Then the wafer is subjected to a diffusion of an N-type impurity as shown by the bracket using, for example, phosphorous oxychloride (POCl$_3$) to create heavily doped N+ regions at 35 - 38 as shown in FIG. 3g. These regions form the source and drain electrodes for the enhancement and depletion devices. Simultaneously with the source and drain diffusions, the silicon gates 32 and 34 are doped heavily so that they are highly conductive. It will also be noted that while the polysilicon will slow the diffusion of a portion of source 37, diffusion into the substrate occurs under gate 34. The direct contact between source 37 and gate 34 will be ohmic and conductive. Thus, where desired, a polysilicon gate can be easily connected to the single crystal silicon.

The POCl$_3$ diffusion is carried out in an oxidizing atmosphere so that the oxide layer is regrown in the exposed regions as shown in FIG. 3g. An oxide also forms to coat the polysilicon gate metal.

The wafer is then coated with a layer 39 of silicon dioxide containing phosphorous oxide as shown in FIG. 3h. This is called a phosphosilicate glass or PSG. Such a glass has a melting temperature well below that of silicon and silicon dioxide and it can easily be vapor deposited. After vapor deposition the wafer is heated to cause the PSG to melt and flow, thus creating a very smooth upper surface. The PSG also acts during the heat treatment to getter the underlying silicon and silicon dioxide of undesirable impurities. The PSG therefore acts to produce highly stable insulated gate transistors as well as to insulate and provide a good surface for subsequent metalization. While not shown, the PSG deposition and heat treatment may cause movement of some of the layer interfaces. However, this action can be compensated by the initial location and concentration being adjusted accordingly.

FIG. 4 shows a completed structure that occurs following contact cuts and metalization. In this portion of the process conventional photolithographic contact cuts are made where desired through the PSG and grown oxide. A heavy layer of aluminum containing about 2% silicon is applied to the wafer and then etched back to provide the desired metalization pattern.

As can be seen in FIG. 4, metal contact 40 provides connection to source 35 and constitutes ground terminal 16 associated with the schematic of FIG. 2. Contact to gate 32 comprises input terminal 13. Metalization 41 connects the drain 36 of the enhancement device to the source 37 and gate 34 of the depletion device to provide circuit output connection 14. Metalization 42 contacts the drain 38 of the depletion device to provide terminal 12 for connection to V$_{DD}$. The pair of devices that make up the inverter circuit are surrounded by peripheral regions 25 which constitute the highest p-type doping in the system and thus act to prevent surface inversion where the metalization crosses over the top of the oxide. This means that even though the substrate 20 is of high resistivity, surface inversion will not be a problem.

It can be seen that electrode 36 only partly overlaps the adjacent region 25. This offset was shown first in FIG. 3d. While not essential to the invention, the offset results in reduced electrode capacitance. Since substrate 20 is of substantially higher resistivity than region 25 and since only a fraction of electrode 36 overlaps region 25, the capacitance of junction electrode 36 is minimized. This capacitance can be substantial in large area devices. In the circuit of FIG. 2 it can be seen that this capacitance would shunt terminal 14 to ground and would thereby slow the operation of the inverter.

Using the above described process has produced devices in a high resistivity substrate in which the enhancement devices had a V$_T$ of about 0.6 volt, the depletion devices had a V$_T$ of about −1.2 to −1.4 volts and the metalization had an inversion voltage greater than 12 volts. Using such a substrate directly without the implants would produce a device V$_T$ of abut −0.1 volt. The same device with only a boron implant (region 25) would have a V$_T$ of about 1 to 1.2 volts (assuming the same gate oxide in all cases).

While the invention has been particularly shown and described with reference to a preferred embodiment thereof, it will be understood by those skilled in the art that various changes in form and details may be made therein without departing from the spirit and scope of the invention.

I claim:

1. The method of making a low voltage high performance MOSFET integrated circuit having an enhancement transistor connected in series with a depletion transistor, said method comprising:

depositing boron through a first mask onto a p-type silicon substrate having a resistivity in excess of about 10 ohm centimeters in the region of said enhancement transistor, said boron deposit acting to substantially lower the silicon resistivity in the region of said enhancement transistor;

growing an oxide layer over said silicon substrate in the openings in said first mask;

depositing phosphorus through a second mask onto said substrate in the regions of said enhancement transistor and said depletion transistor, said phosphorus acting to increase the silicon resistivity in the region of said enhancement transistor and to convert the conductivity type of the silicon in the region of said depletion transistor;

forming source and drain members in each region along with an overlying gate electrode to complete said enhancement and said depletion transistors; and connecting said transistors in series.

2. The method of making a low voltage high performance MOSFET integrated circuit having an enhancement transistor in a first region and a depletion transistor in a second region adjacent said first region, said method comprising the steps of:

depositing through a first mask into said first region of a semiconductor substrate having a resistivity greater than about 10 ohm centimeters and one conductivity type, an impurity of the same conductivity type and in a concentration sufficient to substantially increase conduction in said first region;

diffusing said impurity of said same conductivity type into said substrate;

growing an oxide over said semiconductor;

depositing through a second mask into said first and said second regions of said substrate an impurity of a conductivity opposite to that of said substrate and in a concentration sufficient to reduce the conductivity of said first region but not sufficient to convert it and sufficient to convert the conductivity type of said second region to the opposite conductivity type;

forming source and drain electodes in said first region along with a gate electrode to form an enhancement transistor therein;

forming source and drain electrodes in said second region along with a gate electrode to form a depletion transistor therein; and forming an interconnect pattern to couple said transistors together to form a circuit.

3. The method of claim 2 wherein said last named forming step connects the gate and source of said depletion transistor to the drain of said enhancement transistor.

4. The method of claim 2 wherein said first mask includes an opening defining the field region surrounding both of said transistors.

5. The method of claim 2 wherein said substrate has a resistivity in the range of about 25 to about 45 ohm centimeters.

6. The method of claim 5 wherein said first mask includes an opening defining the field region surround both of said transistors.

* * * * *